United States Patent [19]

Hikichi

[11] Patent Number: 5,459,689

[45] Date of Patent: Oct. 17, 1995

[54] MEMORY DEVICE WITH CURRENT PATH CUT-OFF CIRCUIT FOR SENSE AMPLIFIER

[75] Inventor: Hiroshi Hikichi, Tokyo, Japan

[73] Assignee: NEC Corporation, Tokyo, Japan

[21] Appl. No.: 686,118

[22] Filed: Apr. 15, 1991

[30] Foreign Application Priority Data

Apr. 14, 1990 [JP] Japan ................................. 2-97916

[51] Int. Cl.[6] .................................................. G11C 7/00
[52] U.S. Cl. ..................... 365/189.09; 365/205; 327/56; 327/537
[58] Field of Search ........................... 365/189.09, 205, 365/233, 207; 307/530, 296.8

[56] References Cited

U.S. PATENT DOCUMENTS

| | | | |
|---|---|---|---|
| 4,404,660 | 9/1983 | Menachem | 365/189.09 |
| 4,758,748 | 7/1988 | Takeuchi | 365/189.09 |
| 4,884,241 | 11/1989 | Tanaka et al. | 365/189.09 |
| 5,050,127 | 9/1991 | Mitsumoto et al. | 307/530 |
| 5,130,580 | 7/1992 | Min et al. | 307/530 |
| 5,140,199 | 8/1992 | Seo | 365/233 |
| 5,146,427 | 9/1992 | Sasaki et al. | 365/233 |
| 5,175,451 | 12/1992 | Ihara | 365/205 |
| 5,202,854 | 4/1993 | Koike | 365/205 |
| 5,267,198 | 11/1993 | Hatano et al. | 365/189.01 |
| 5,293,338 | 3/1994 | Ihara | 365/189.09 |

Primary Examiner—Georgia Y. Epps
Assistant Examiner—Tan Dinh

[57] ABSTRACT

A memory device has memory cells each of which is addressed according to a timing signal, current sense amplifiers each of which determines whether a current flows in the addressed memory cell or not and reads-out the data stored in such memory cell, a circuit which generates a control signal to become active at a timing when the memory cell is addressed and to become inactive after the read-out of the stored data is completed by the current sense amplifier, and a circuit which cuts-off based on the control signal a current path of a steady-state current flowing in the current sense amplifier. It is possible to substantially reduce power consumption without sacrificing the capability of the read-out the stored data at a high speed.

4 Claims, 5 Drawing Sheets

MEMORY DEVICE WITH CURRENT PATH CUT-OFF CIRCUIT FOR SENSE AMPLIFIER

BACKGROUND OF THE INVENTION

The present invention relates to a memory device and, more particularly, to a read only memory (hereinafter referred to as "ROM") which is incorporated in such an information processor as a microcomputer and comprising complementary type metal oxide film semiconductors.

When it is necessary to read out data stored in a memory device at a high speed, for instance, when a high speed operation is required in a device such as a microcomputer incorporating a ROM in which a program to be executed is stored and also it is necessary to read out stored data at a high speed, generally a current sense amplifier is adopted as a circuit which detects and outputs the data stored in a memory cell.

FIG. 5 is a circuit diagram showing a portion of a memory cell and an example of a conventional current sense amplifier. In this diagram, A1 and A2 are address lines; D1 is a data line; Q101 and Q102 are memory cells consisting of n-channel MOS transistors (hereinafter referred to as "nMOS"); 1a is a current sense amplifier consisting of nMOSs Q1, Q2, p-channel MOS transistors (hereinafter referred to as "pMOS") Q11, Q12, and inverters I1, I7; and 2a is a reference voltage generating circuit consisting of nMOSs Q3 to Q5, nMOSs Q13, Q14; and an inverter I8, which supplies a reference voltage to the current sense amplifier 1a.

Explanation is hereunder made for actual operations of the conventional circuit shown in FIG. 5. If it is assumed that the address line A1 is set to a high level (power supply voltage $V_{DD}$ level) and the address line A2 to a low level (GND level), then the memory cell Q101 with the address line A1 as a gate input turns ON, while the memory cell 102 with the address line A2 as a gate input turns OFF. As the memory cell Q101 is not connected to the data line D1. However, an impedance viewed from a node N1 to the direction of the data line D1 is infinite. Under this state, the pMOS Q11 turns ON, but a current path for this transistor is not established, so that a voltage at the node N1 is $V_{DD}$-$V_{TP}$ ($V_{TP}$ being a threshold voltage for the pMOS (Q11) and being approximately 0.8 V). As the node N1 is connected to a gate of the pMOS Q12, the pMOS Q12 is kept substantially OFF, and as a voltage enough for this nMOS Q2 to turn ON as described later is supplied to a gate of the nMOS Q2 from the reference voltage generating circuit 2a under this state, the node N2 goes down to the low level. Thus, the high level output is obtained as stored data from an output terminal of the inverter circuit I1.

To the contrary, if the address line A2 is at the high level and the address line A1 at the low level, the memory cell Q102 turns ON, so that a steady-state current flows from the $V_{DD}$ power source through the pMOS Q11, the nMOS Q1, the data line D1, the memory cell Q102 to the ground. For this reason, a potential at the node N1 becomes closer to the GND potential than to the potential $V_{DD}$-$V_{PT}$ which is determined by a ratio of ON resistance of the memory cell Q102, the nMOS Q1 and the pMOS Q11. This potential is sufficiently large for the pMOS Q12 to turn ON, so that the potential at the node N2 becomes closer to the potential $V_{DD}$ and the low level output is obtained as stored data from the output terminal of the inverter circuit I1.

From the reference voltage generating circuit 2a, a reference voltage determined according to a ratio of ON resistance of the nMOS Q5 and that of the pMOS Q14 is outputted. Also, a voltage determined by a ratio of ON resistance of the nMOSs Q3 and Q4 as well as the pMOS Q13 is applied to a gate of the pMOS Q14, and the reference voltage is controlled so that the nMOS Q2 turns ON and the low level output or the high level output is outputted at the node N2 according to the voltage appearing at the node N1.

As described above, the current sense amplifier determines whether an nMOS (memory cell) is connected to the data line D1 or not, by detecting whether a current is flowing through the current path or not, and reads out the stored data as a logic value. So it can immediately read out the data stored in the accessed or specified memory cell when any address line is active, thus enabling high speed read-out operation of the data.

In the memory cell device described above, in the reference voltage generating circuit 2a, a steady-state current is flowing through the current path consisting of the nMOSs Q3, Q4 and the pMOS Q13, and also a steady-state current is flowing through the circuit consisting of the nMOS Q5 and the pMOS Q14. Also, in the current sense amplifier 1a, a steady-state current is flowing in the current path consisting of the nMOS Q1 and the pMOS Q11 and in the current path consisting of the nMOS Q2 and the pMOS Q12.

In a microcomputer, data is stored by 8 bits as a unit in a ROM, and read-out is also made by 8 bits as a unit, so that eight (8) current sense amplifiers are required. A steady-state current which flows in one current sense amplifier is approximately 200 µA under the state where the power supply voltage $V_{DD}$ is 5 V. For this reason, in the entire current sense amplifier circuit per data unit, although it depends on a quantity of the data stored in the memory cell, a current of around 1 mA flows steadily. This current flows steadily irrespective of a processing operation frequency (clock frequency) in the microcomputer so that, in applications where, for instance, a high speed processing operation is not required but the power consumption must be low (e.g., an application where a battery back-up is provided in case of power failure, or an application in which a battery is used as a power source), the power consumption is too high. This means that such a conventional memory device lacks utility for general purpose microcomputers.

SUMMARY OF THE INVENTION

It is, therefore, an object of the invention to overcome the above and other problems existing in the conventional memory device and to provide an improved memory device which is capable of reducing power consumption without sacrificing the capability to read out stored data at a high speed.

According to one aspect of the invention, there is provided a memory device which comprises:

a plurality of memory cells;

a plurality of current sense amplifiers each for detecting whether a current flows in the memory cell which is addressed and reading out data stored in the memory cell;

a reference voltage generating circuit for supplying a reference voltage to each of the current sense amplifiers;

a control means for generating a control signal which becomes active in synchronization with the addressing of the memory cell and becomes inactive after the reading-out of the data stored in the memory cell is completed;

a circuit means for cutting-off a current path of a steady-state current in each of the current sense amplifiers based on the control signal generated by the control means; and a circuit means for cutting-off a current path of a steady-state current in the reference voltage generating circuit based on the control signal generated by the control means.

In the memory device according to this invention, the current sense amplifier and the reference voltage generating circuit are caused to start their operations from the timing of the addressing of a memory cell and a steady-state current in the current sense amplifier or the reference voltage generating circuit is caused to be cut-off when the current sense type amplifier has completed reading-out the data in the memory cell, so that it is possible to substantially reduce power consumption without sacrificing the capability to read out the stored data at a high speed.

Accordingly, where the memory device according to the present invention is incorporated in, for instance, a microcomputer, such microcomputer is available for an application requiring high speed operations and also for an application with a low power consumption, and the general purpose utility is improved.

BRIEF DESCRIPTION OF THE DRAWINGS

The above and other objects, features and advantages of the present invention will be apparent from the following description of preferred embodiments of the invention, with reference to the accompanying drawings, in which.

PREFERRED EMBODIMENTS OF THE INVENTION

Throughout the following explanation, similar reference symbols or numerals refer to the same or similar elements in all the figures of the drawings.

A memory device according to the present invention has memory cells, each of which is addressed according to a specified timing, a current sense amplifier which determines whether a current is flowing in the addressed memory cell or not and reads out data stored in such memory cell, a circuit which generates a control signal activated at a timing when the memory cell is addressed and inactivated after read-out of the stored data is completed, and a circuit which cuts-off based on the control signal a current path for a steady-state current flowing in the current sense amplifier.

Now, description is hereunder made for some embodiments of the present invention, referring to the attached drawings.

Figure 1:
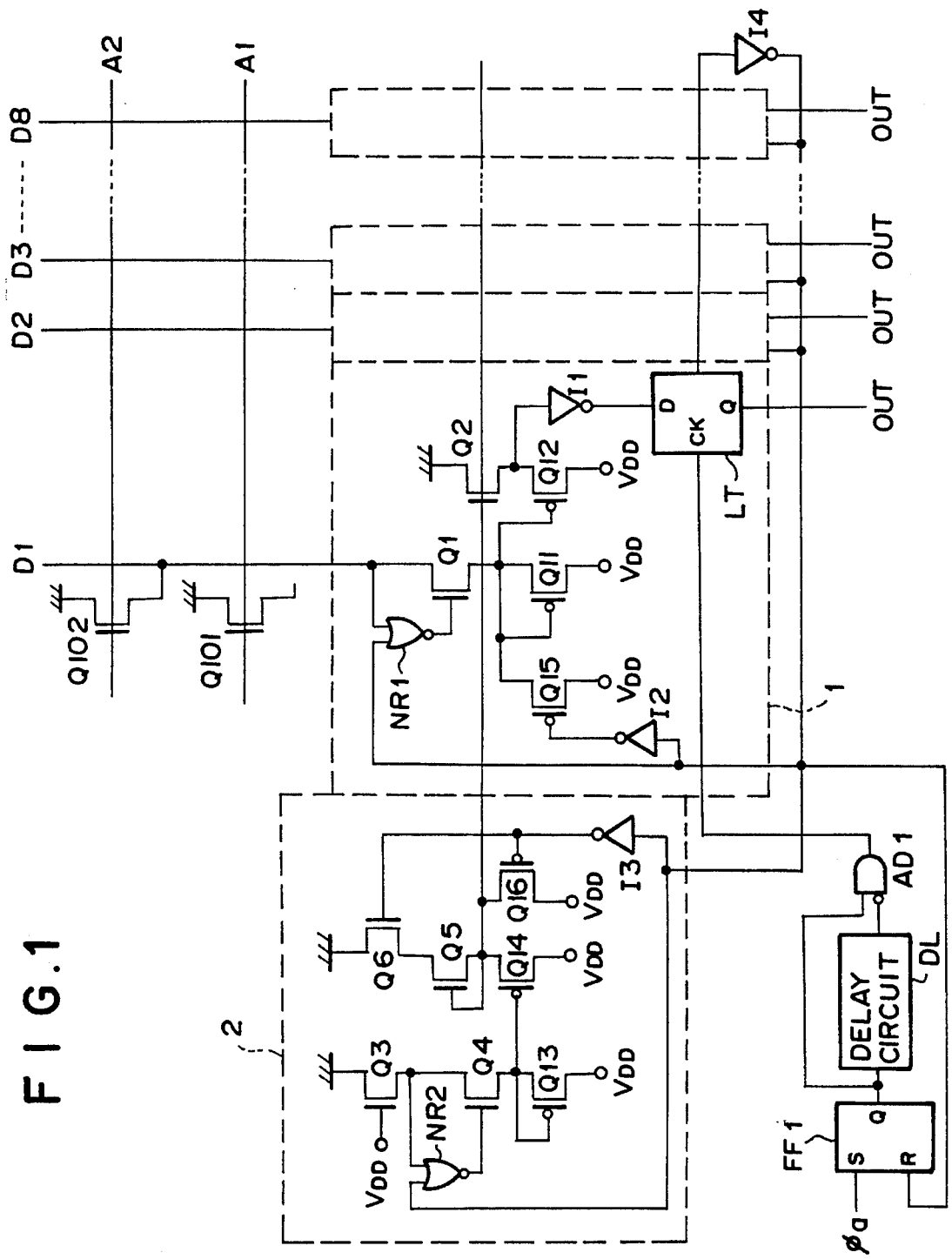
FIG. 1 is a circuit diagram showing a first embodiment of this invention.
Figure 5:
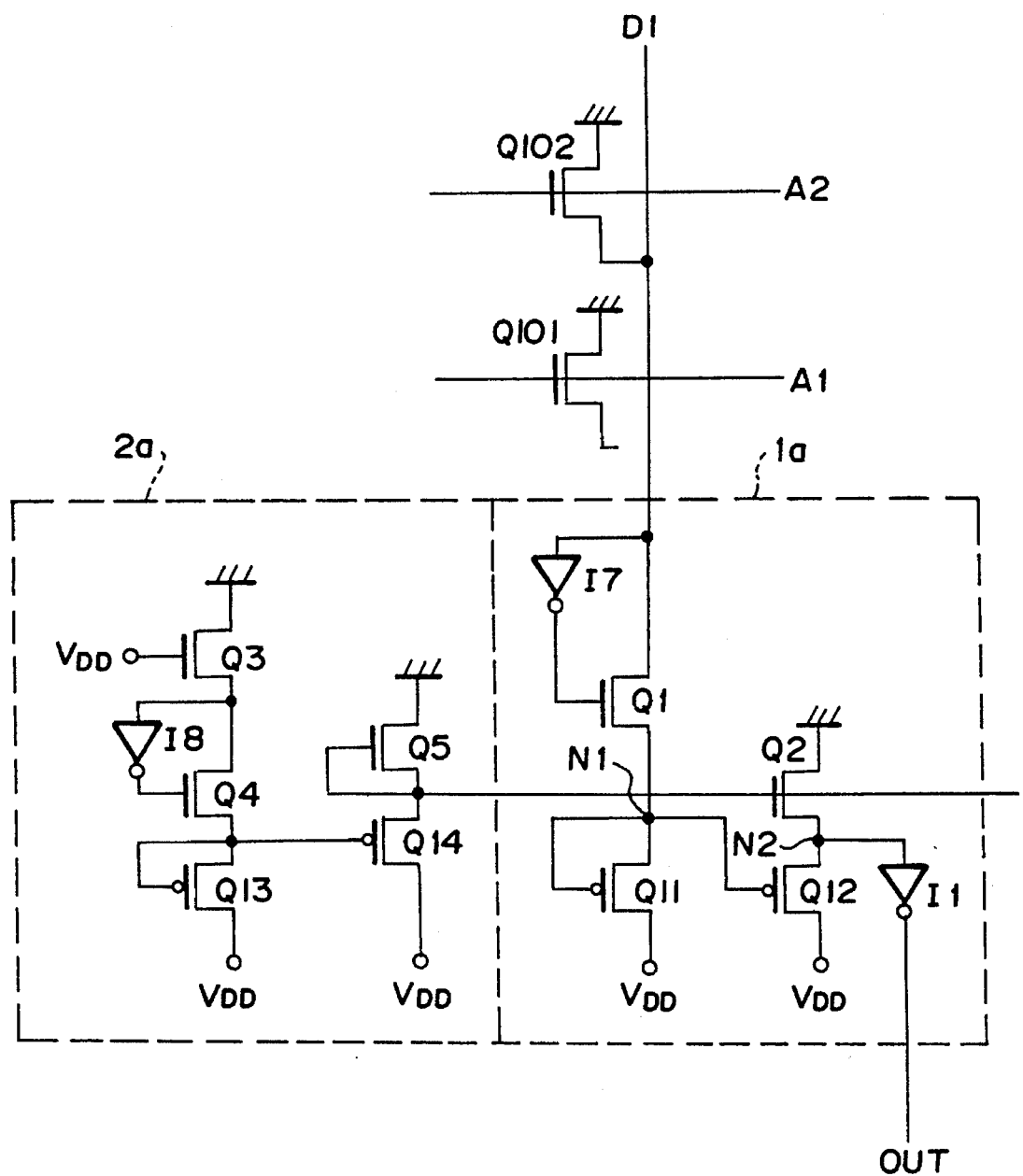
FIG. 5 is a circuit diagram of a conventional device.

FIG. 1 is a circuit diagram showing a first embodiment of the present invention. This embodiment is an example having eight (8) data lines from D1 to D8, and in FIG. 1, only the amplifier of current sense type coupled to the data line D1 is shown in detail. In this drawings, the same reference numerals or symbols as those used in FIG. 5 are assigned to the same or like elements.

As shown in FIG. 1, a timing signal φa indicating the timing for address change of the memory cell is inputted to a set terminal (S) of an R-S flip-flop FF1, and an output terminal (Q) of the R-S flip-flop FF1 is connected to one of input terminals of a 2-input AND circuit AD1 as well as to an input terminal of a delay circuit DL. A delay time in this delay circuit DL is preset to a value representing the time from the address change to the completion of the data reading-out operation carried out by the current sense amplifier plus a margin time. An output from the delay circuit DL is inverted and then inputted to the other input terminal of the AND circuit AD1. An output from the 2-input AND circuit AD1 is inputted first to a latch LT and then inputted to an inverter circuit I4.

The current sense amplifier 1 in this embodiment comprises the nMOSs Q1 and Q2, the pMOSs Q11, Q12, Q15, the inverter circuits I1 and I2, a 2-input NOR circuit NR1, and the latch LT. Differences in this current sense amplifier 1 from a conventional one are (1) that in place of the inverter circuit I7, the 2-input NOR circuit NR1 with the 2-input terminals connected to the data line D1 and the inverter circuit I4 respectively and with the output terminal connected to a gate of the nMOS Q1 are arranged; (2) that, in parallel to the pMOS Q11, the pMOS Q15 to which an output from the inverter circuit I4 is inputted via the inverter I2 is arranged; and (3) that an output signal from the current sense amplifier is taken out via the latch LT. The latch LT is a circuit which performs an unlatch operation, namely an operation to transfer an output as it is from the inverter circuit I1 to an output terminal OUT when an output from the 2-input AND circuit AD1 is a high level, and a latch operation, namely an operation to maintain an output from the inverter I1 immediately before the AND circuit AD1 goes down to the low level when an output from the AND circuit AD1 is a low level.

The reference voltage generating circuit 2 in this embodiment comprises the nMOSs Q3 to Q6, the pMOSs Q13, Q14 and Q16, an inverter circuit I3, and a 2-input NOR circuit NR2. Differences in this reference voltage generating circuit 2 from the conventional example shown in FIG. 5 are (1) that, in place of the inverter circuit I8, the 2-input NOR circuit NR 2 with the two input terminals coupled to an output terminal of the inverter circuit I4 and a drain of the nMOS Q3 respectively and with the output terminal connected to a gate of the nMOS Q4 is provided; (2) that the nMOS Q6, to a gate of which an output from the inverter circuit I4 is inputted via the inverter circuit I3, is provided between the nMOS Q5 and the ground; and (3) that, in parallel to the pMOS Q14, the pMOS Q16, to a gate of which an output from the inverter circuit I4 is inputted via the inverter circuit I3, is connected.

Figure 2:
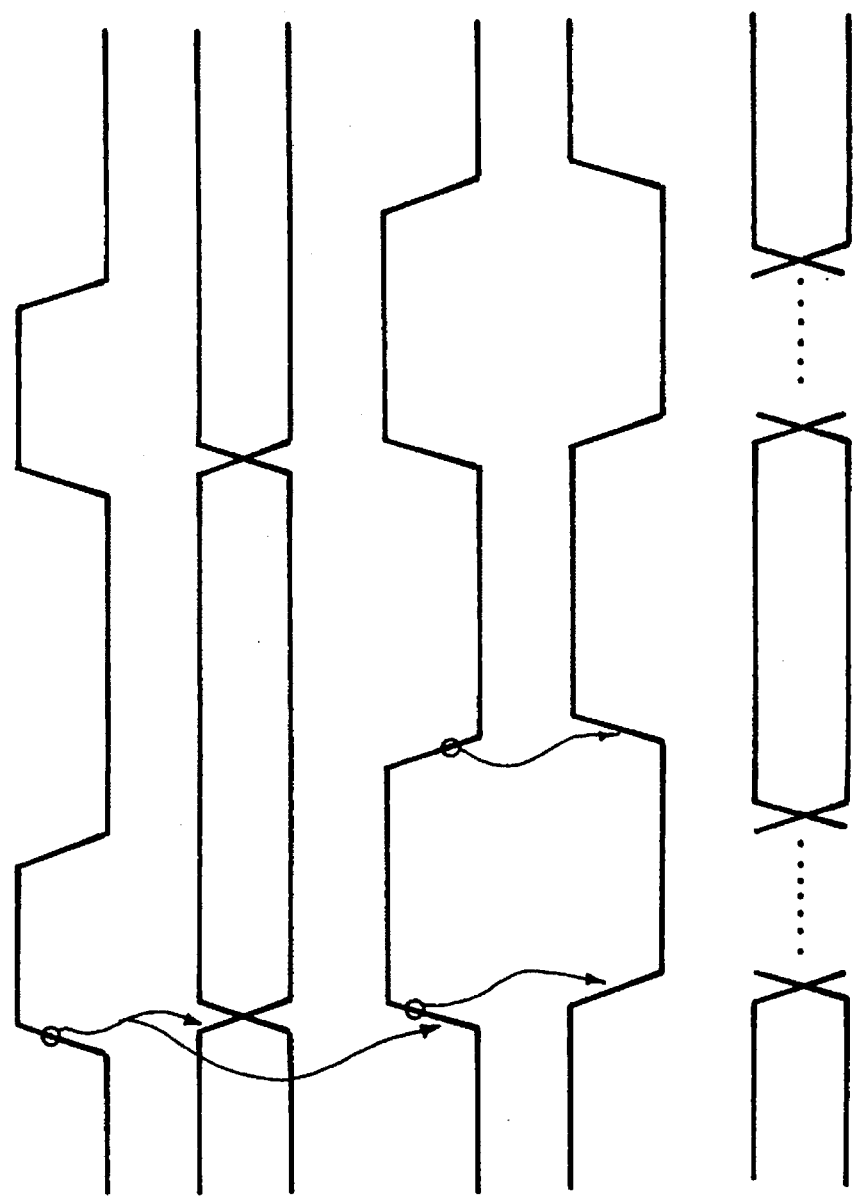
FIG. 2 is a timing chart for the principal signals in the FIG. 1 circuit.

Explanation is hereunder made for operations of the circuits in this embodiment, referring to the timing chart in FIG. 2. First, when the timing signal φa goes to the high level, the memory cell address is updated (a specified address line goes to the high level), and a specified memory cell is selected (FIG.2 (b)). As the R-S flip-flop FF1 is set according to the timing signal φa and an output from the R-S flip-flop FF1 goes up to the high level (assuming that the output from the R-S flip-flop FF1 has been low before the timing signal φa goes up to the high level), the output from the 2-input AND circuit AD1 is kept at the high level for the delay time set in the delay circuit DL (FIG. 2 (c)). As an output from the 2-input AND circuit AD1 is a latch signal for the latch LT, the latch LT transfers an output as it is from the inverter I1 to the output terminal OUT. The output from the 2-input AND circuit AD1 is inputted as the latch signal to the eight (8) latches and then inputted to the inverter circuit I4, so that the output from the inverter circuit I4 goes down to the low level (FIG.2 (d)). When the output from the inverter circuit I4 is at the low level, the 2-input NOR circuits NR1 and NR2 transfer the respective potentials of the data line D1 and the drain of the nMOS transistors Q3 to the respective gates of the nMOS Q1 and the NMOS Q4, and outputs from the inverter circuits I2 and I3 go to the high level, so that the pMOS transistors Q15 and Q16 turn OFF respectively, while the nMOS transistor Q6 turns ON. Accordingly, in this case, the reference voltage generating circuit 2 generates a reference voltage determined by a ratio of ON resistance at the nMOSs Q5 and Q6 against that at the pMOS Q14, and the voltage thus generated is supplied to the gate of the nMOS Q2 in the current sense amplifier 1. Then, the current sense amplifier performs the normal sense amplifying operations and if the address line A1 is at the high level and the memory cell Q101 has been selected, a drain potential of the pMOS Q11 is $V_{DD}$-$V_{TP}$, whereby the pMOS Q12 is kept substantially OFF and an input to the inverter circuit I1 goes down to the low level. As an output from the inverter circuit I1, the high level is read out, and the high level is transferred from the latch LT to the output terminal OUT. Also, if the address line A2 is at the high level and the memory cell Q102 has been selected a potential at the gate of the pMOS Q12 is close to the GND level, while a potential of the input of the inverter circuit I1 is close to the high level, and the output from the inverter circuit I1 goes down to the low level. Accordingly, the low level is transferred as read-out data to the output terminal OUT via the latch LT.

Next, when a predetermined period of time (for instance, approximately 300 nsec) passes, an output from the delay circuit DL goes to the high level, while the 2-input AND circuit AD1 goes down to the low level as an inverted output from the delay circuit DL is inputted to it. Then, the latch LT reads out the output level from the inverter circuit I1 at the instant the output from the 2-input AND circuit AD1 changes from the high level to the low level and holds it as read-out data.

On the other hand, the inverter circuit I4 goes up to the high level after the eight (8) latches hold read-out data, and resets the R-S flip-flop FF1. Because the output from the inverter circuit I4 goes to the high level, outputs from the 2-input NOR circuits NR1 and NR2 go down to the low level, and the nMOSs Q1 and Q4 are turned OFF. Also, as outputs from the inverters I2 and I3 go down to the low level, the nMOS Q6 turns OFF and the pMOSs Q15 and Q16 turn ON. For this reason, a steady-state current path consisting of the nMOSs Q3, Q4 and the pMOS Q13, a steady-state current path consisting of the nMOSs Q5, Q6 and the pMOS Q14, as well as a steady-state current path consisting of the nMOS Q1 and the pMOS Q11 are all cut-off. At this time, the nMOS Q2 turns ON as the voltage $V_{DD}$ is applied to its gate as a reference voltage, but the pMOS Q12 is substantially in an OFF state as the voltage $V_{DD}$ is applied to its gate, and accordingly the high level is outputted to the output terminal of the inverter circuit I1. At this point of time, however, as the output from the 2-input AND circuit AD1 has already gone down to the low level, the latch LT continues to hold the previously read-out data.

In summary, this embodiment executes a read-out operation for only the delay time determined by the delay circuit DL, holds the read-out data, and then cuts-off all of steady-state currents therein. For this reason, this embodiment enables substantial reduction of power consumption. For instance, assuming that a period of the timing signal φa is 30 μ sec with the delay time in the delay circuit DL of 300 n sec and the steady-state current of 1 mA, the average current will be in the order of 10 μA, which means a substantial reduction of power consumption.

Figure 3:
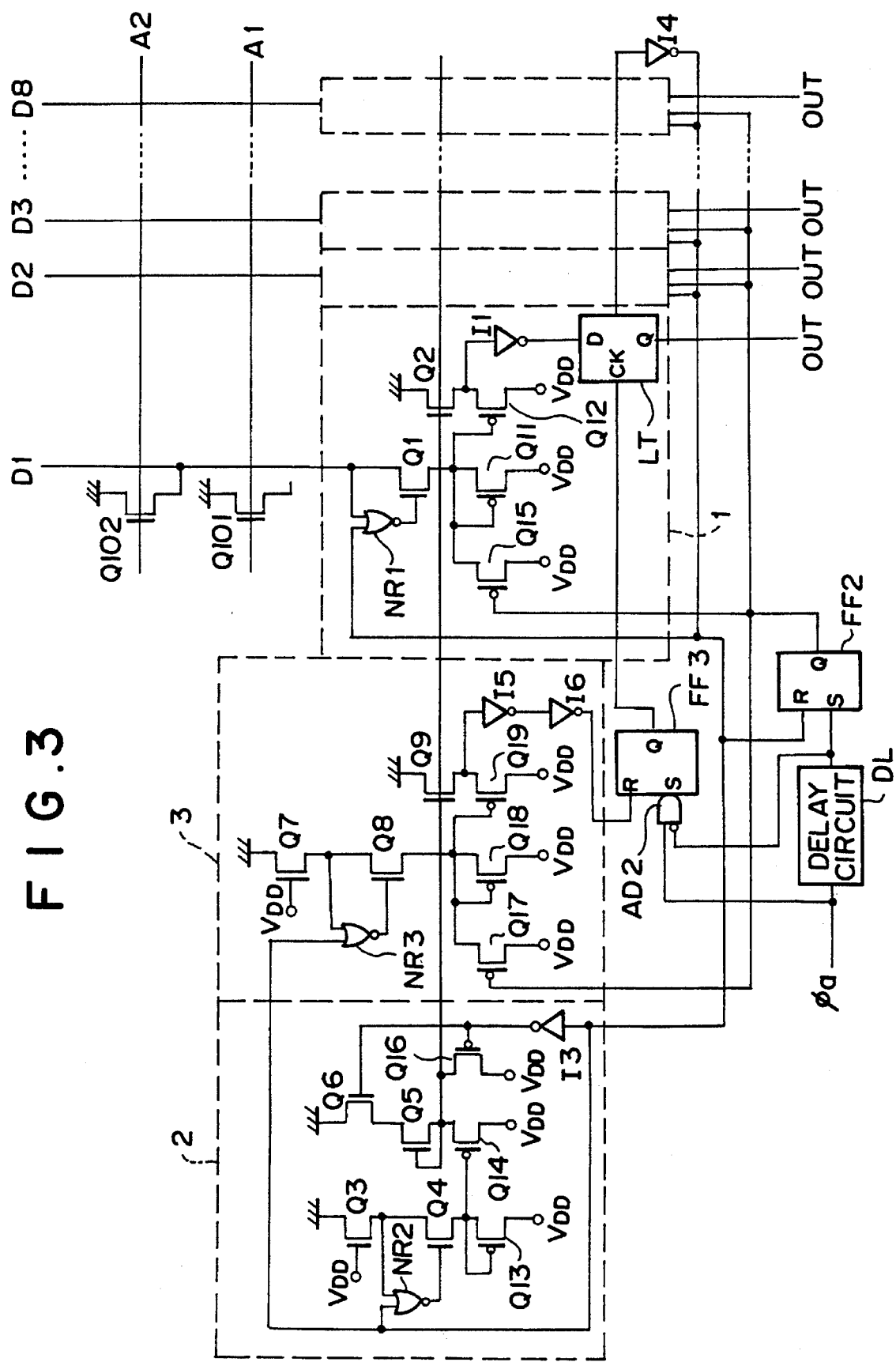
FIG. 3 is a circuit diagram showing a second embodiment of this invention.

FIG. 8 is a circuit diagram showing a second embodiment of the present invention. In FIG. 3, the same reference numerals or symbols those used in FIG. 1 are assigned to the same or equivalent elements.

As shown in FIG. 8, the timing signal φa is inputted to the delay circuit DL with the delay time of 30 to 50 n sec and to one of the two input terminals of a 2-input AND circuit AD2, and an output signal from the delay circuit DL is inputted to an R-S flip-flop FF2 as a set signal. Also, an inverted output from the delay circuit DL is inputted to the other input terminal of the 2-input AND circuit AD2, and an output signal from the 2-input AND circuit AD2 is inputted to an R-S flip-flop FF8 as a set signal. An output signal from the R-S flip-flop FF8 is inputted to the latch LT and is forwarded to the inverter I4 after having passed through the eight latches as a latch signal.

In the current sense amplifier 1 of this second embodiment the inverter circuit I2 is removed from that in the first embodiment shown in FIG. 1, and an output signal from the R-S flip-flop FF2 is Inputted to the gate of the pMOS Q15. The reference voltage generating circuit 2 has the same circuit configuration as that of the first embodiment.

A dummy sense amplifier 3 added in this embodiment comprises nMOSs Q7 to Q9, pMOSs Q17 to Q19, inverter circuits I5, I6, and a 2-input NOR circuit NR3. An output signal of the dummy sense amplifier 3 is applied, as a reset signal, to the R-S flip-flop FF3. The dummy sense amplifier 3 is designed so as to have functions and characteristics equivalent to those in the current sense amplifier 1, so that each component of the dummy sense amplifier 3 is designed so as to have characteristics equivalent to those of each corresponding component of the current sense amplifier 1. Namely, the dummy sense amplifier 3 and each component of the dummy sense amplifier 3 are designed with the same form, size, and arrangement of transistors so that the nMOSs Q7, Q8 and Q9 may have the same electric characteristics as those of the memory cell Q101 (or Q102), the nMOSs Q1 and Q2 respectively, the pMOSs Q17, Q18 and Q19 may have the same electric characteristics as those of the pMOS Q15, Q11 and Q12 respectively, the NOR circuit NR3 may have the same electric characteristics as those of the NOR circuit NR1, and the inverter circuit I5 may have the same electric characteristics as those of the inverter I1.

Figure 4:
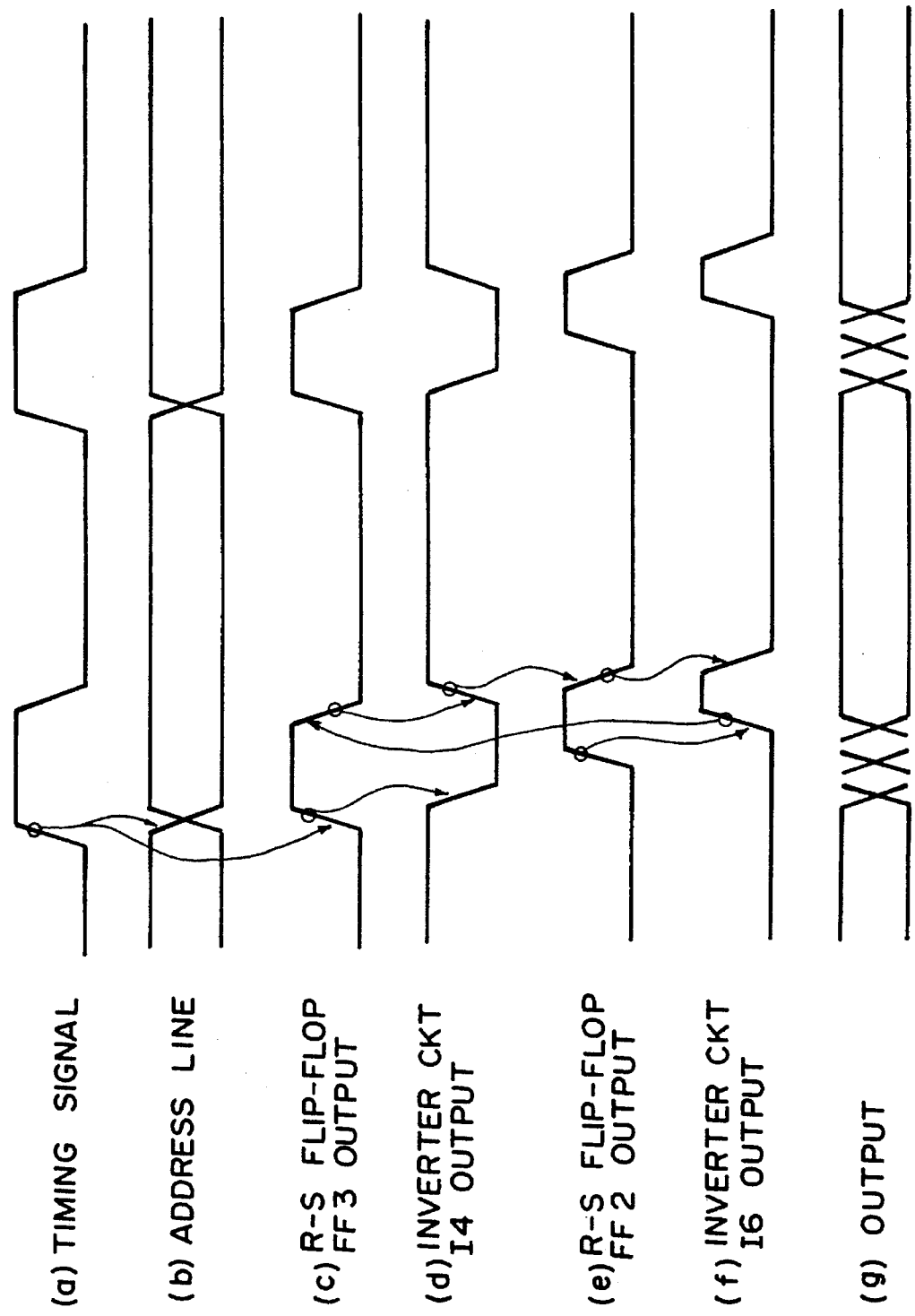
FIG. 4 is a timing chart for the principal signals In the FIG. 3 circuit.

Explanation is hereunder made for operations of the circuit of this second embodiment shown in FIG. 3, referring to a timing chart illustrated in FIG. 4.

First, at the instant the timing signal φa goes up to the high level, an output from the delay circuit is still kept at the low level, so that an output from the 2-input AND circuit AD2 goes up to the high level and an output from the R-S flip-flop FF3 goes up to the high level (FIG. 4(c)). Consequently, an output from the inverter circuit I4 goes down to the low level (FIG. 4 (d)), and the 2-input NOR circuits NR1, NR2 and NR3 transfer potentials of the data line D1 and drain potentials of the nMOSs Q3 and Q7 to the respective gates of the nMOS Q1, nMOS Q4 and nMOS Q8. Also as an output from the inverter I3 goes up to the high level, the nMOS Q6 turns ON while the pMOS Q16 turns OFF.

At this moment, as an output from the delay circuit DL is kept at the low level, an output from the R-S flip-flop FF2 still remains at the low level, and the pMOSs Q15 and Q17 are ON, respectively. In this state, a reference voltage determined according to ON resistance ratio of the nMOSs Q5, Q6 and the pMOS Q14 is generated in the reference voltage generating circuit 2, and a voltage determined according to ON resistance ratio of the nMOSs Q7, Q8 and the pMOS Q17 is applied to the gate of the pMOS Q19. If both the pMOSs Q15 and Q17 are so designed to have adequately small ON resistance, a voltage close to the power supply voltage $V_{DD}$ is applied to the gate of the pMOS Q19. Accordingly, the ON resistance of the pMOS Q19 is larger than that of the nMOS Q9, the low level is inputted to the inverter I5, and the inverter I6 provides an output signal of low level accordingly. In the current sense amplifier 1, as the ON resistance of the pMOS Q15 is low, an output from the inverter circuit I1 goes up to the high level no matter which memory cell is selected by the address line.

Then, when the delay circuit DL provides an output of the high level after the delay time of 30 to 50 n sec has passed, an output from the R-S flip-flop FF2 goes up to the high level (FIG.4 (e)), the pMOSs Q15 and Q17 turn OFF, and a gate potential of the pMOS Q19 becomes closer to the GND potential, which is determined by the ON resistance ratio of the nMOSs Q7, Q8 and the pMOS Q18. For this reason, the ON resistance of the pMOS Q19 becomes smaller than the ON resistance of the nMOS Q9, and thus an output from the inverter circuit I5 goes down to the low level and an output from the inverter I6 goes up to the high level (FIG. 4(f)). Accordingly, the R-S flip-flop FF3 is reset, and the output thereof goes down to the low level (FIG. 4 (c)).

On the other hand, because an output from the R-S flip-flop FF2 goes up to the high level and the pMOS Q15 turns OFF, the current sense amplifier 1 starts operating as an ordinary current sense amplifier. Accordingly, at this moment, if the memory cell Q101 has been selected, an output from the inverter I1 is kept at the high level, but if the memory cell Q102 has been selected, an output from the inverter circuit I1 Is inverted to the low level. The timing when an output from the inverter circuit I1 goes down to the low level is almost equal to the timing when an output from the inverter circuit I5 goes down to the low level, so that, when an output from the R-S flip-flop FF3 goes down to the low level, the inverter circuit I1 has already completed reading out of the data stored in the memory cell. The read-out data is latched in the latch LT. Then, as the inverter circuit I4 goes up to the high level, the outputs from the 2-input NOR circuits NR1, NR2 and NR3 go down to the low level, respectively, and the nMOSs Q1, Q4 and Q8 accordingly turn OFF, respectively. Also, as an output from the inverter circuit I3 goes down to the low level, the nMOS Q6 turns OFF, while the pMOS Q16 turns ON, and the reference voltage is set to the $V_{DD}$ level. Furthermore, because an output from the inverter circuit I4 goes up to the high level, an output from the R-S flip-flop FF2 goes down to the low level, and the pMOSs Q15 and Q17 turn ON. For this reason, all of the steady-state current paths are cut-off.

As described above, in this embodiment, a data readout operation of the current sense amplifier 1 is simulated by the dummy sense amplifier 3, and a steady-state current is allowed to flow only for the period of time required for this data read-out operation (100 to 150 n sec) plus the delay time in the delay circuit DL (30 to 50 n sec). For this reason, as the time for a steady-state current to flow in this embodiment is at most 200 n sec, power consumption is reduced more than in the previous embodiment in which the steady-state current flows for 300 n sec.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A memory device comprising:

a plurality of memory cells;

a plurality of current sense amplifiers each for detecting whether a current flows in a memory cell which is addressed and reading out data stored in said memory cell;

a reference voltage generating circuit for supplying a reference voltage to each of said current sense amplifiers;

a control means for generating a control signal which becomes active in synchronization with the addressing of said memory cell and becomes inactive after the reading-out of the data stored in said memory cell is completed;

a first circuit means for permitting each of said current sense amplifiers to operate only at a timing while said control signal generated by said control means is being active and for cutting-off a current path of a steady-state current in each of said current sense amplifiers at other timings while said control signal is being inactive; and a second circuit means for permitting said reference voltage generating circuit to operate only at the timing while said control signal generated by said control means is active and for cutting-off a current path of a steady-state current in said reference voltage generating circuit at the other timings while said control signal is being inactive.

2. A memory device according to claim 1, in which said current path of a steady-state current is formed by a plurality of transistors connected in series and at least one of said transistors connected in series is rendered to be an OFF state based on said control signal so that said current path is cut-off.

3. A memory device comprising:

a plurality of memory cells;

a plurality of current sense amplifiers each for detecting whether a current flows in a memory cell which is addressed and reading out data stored in said memory cell;

a reference voltage generating circuit for supplying a reference voltage to each of said current sense amplifiers;

a control means for generating a control signal which becomes active in synchronization with the addressing of said memory cell and becomes inactive after the reading-out of the data stored in said memory cell is completed;

a first circuit means for permitting each of said current sense amplifiers to operate only at a timing while said control signal generated by said control means is being active and for cutting-off a current path of a steady-state current in each of said current sense amplifiers at other timings while said control signal is being inactive;

a second circuit means for permitting said reference voltage generating circuit to operate only at the timing while said control signal generated by said control means is active and for cutting-off a current path of a steady-state current in said reference voltage generating circuit at the other timings while said control signal is being inactive; and a recognizing circuit means for recognizing completion of a data read-out operation carried out by said current sense amplifier, said recognizing circuit means being for inactivating said control signal generated by said control means after recognition of the completion of the data read-out operation carried out by said current sense amplifier.

4. A memory device according to claim 3, in which said recognizing circuit means for recognizing the completion of data read out operation is a dummy sense amplifier whose circuit configuration is equivalent to said current sense amplifier.

* * * * *